(12) United States Patent
Sawada et al.

(10) Patent No.: US 8,704,692 B2
(45) Date of Patent: Apr. 22, 2014

(54) DIGITAL TO ANALOG CONVERTER

(75) Inventors: Ken'ichi Sawada, Tokyo (JP); Shoji Kojima, Tokyo (JP)

(73) Assignee: Advantest Corporation, Tokyo (JP)

(*) Notice: Subject to any disclaimer, the term of this patent is extended or adjusted under 35 U.S.C. 154(b) by 37 days.

(21) Appl. No.: 13/360,610

(22) Filed: Jan. 27, 2012

(65) Prior Publication Data

US 2012/0194374 A1 Aug. 2, 2012

(30) Foreign Application Priority Data

Feb. 1, 2011 (JP) ................................. 2011-020086

(51) Int. Cl.
*H03M 1/80* (2006.01)

(52) U.S. Cl.
USPC ........................................ 341/154; 341/144

(58) Field of Classification Search
USPC ........................................ 341/144, 153, 154
See application file for complete search history.

(56) References Cited

U.S. PATENT DOCUMENTS

| 4,918,448 | A | | 4/1990 | Hauviller et al. ............. 341/145 |
|---|---|---|---|---|
| 5,568,147 | A | * | 10/1996 | Matsuda et al. ............. 341/154 |
| 5,648,780 | A | * | 7/1997 | Neidorff ........................ 341/154 |
| 2009/0079609 | A1 | * | 3/2009 | Hsu ................................ 341/144 |

FOREIGN PATENT DOCUMENTS

| JP | 61287311 | A | * | 12/1986 |
|---|---|---|---|---|
| JP | 04150229 | A | * | 5/1992 |
| JP | 04290012 | A | * | 10/1992 |
| JP | 06177766 | A | * | 6/1994 |

* cited by examiner

*Primary Examiner* — Howard Williams
(74) *Attorney, Agent, or Firm* — Ladas & Parry, LLP

(57) ABSTRACT

N upper-side resistors and N lower-side resistors are severally associated with respective bits of a digital input code. Each resistance value is weighted in an essentially binary manner according to the corresponding bit. N upper-side switches are each arranged in parallel with a corresponding upper-side resistor, and each is configured such that its on/off state is controlled according to the corresponding bit. N lower-side switches are each arranged in parallel with a corresponding lower-side resistor, and each is configured such that its on/off state is controlled according to logical inversion of the corresponding bit.

6 Claims, 10 Drawing Sheets

RELATED ART

100a

100b

100d

DIGITAL TO ANALOG CONVERTER

CROSS-REFERENCE TO RELATED APPLICATIONS

This application claims to priority to Japanese Patent Application No. 2011-020086 filed on Feb. 1, 2011 the disclosure of which is incorporated herein by reference.

BACKGROUND OF THE INVENTION

1. Field of the Invention

The present invention relates to a D/A converter.

2. Description of the Related Art

As an interface between digital signal processing and analog signal processing, a D/A converter (digital/analog converter) is employed. FIG. 1 is a circuit diagram which shows a configuration of a three-bit resistor string D/A converter. A D/A converter 100r includes a resistor string 10 including multiple resistors R connected in series and a switch circuit 12. Two reference voltages, i.e., a higher reference voltage VRH and a lower reference voltage VRL, are applied to respective terminals of the resistor string 10. According to a digital input code $D_{IN}$(B2:B0), the switch circuit 12 selects one from among voltages that develop at respective connection nodes (taps) that each connect the adjacent resistors R.

The switch circuit 12 includes multiple two-to-one switches (selectors) SW connected to the multiple taps in tournament form. With such a D/A converter 100r, with the number of bits of the input digital code $D_{IN}$ as N (N represents an integer), the number of resistors R and the number of switches SW are each represented by $2^N-1$. Accordingly, as the number of bits N of the D/A converter increases, the number of resistors R and the number of switches SW increase in an exponential manner, leading to an increased circuit area.

In order to provide a reduced circuit area of such a resistor string D/A converter, several circuit configurations have been proposed (see Patent document 1, for example). However, even if such a technique described in Patent document 1 is employed, the circuit area increases in an exponential manner according to the number of bits N.

With an R-2R ladder D/A converter having a configuration other than a resistor string configuration, for example, such an arrangement provides a reduced circuit area. However, such an arrangement leads to a different problem of increased power consumption.

RELATED ART DOCUMENTS

Patent Documents

Patent Document 1
U.S. Pat. No. 4,918,448 Specification

SUMMARY OF THE INVENTION

The present invention has been made in view of such a situation. Accordingly, it is an exemplary purpose of the present invention to provide a D/A converter having a reduced circuit area.

An embodiment of the present invention relates to a D/A converter configured to convert an N-bit (N represents an integer) digital input code into an analog output voltage that corresponds to the digital input code. The D/A converter comprises: an upper-side terminal to which an upper-side reference voltage is applied; a lower-side terminal to which a lower-side reference voltage is applied; an output terminal configured to output the analog output voltage; N upper-side resistors that are respectively associated with the respective bits of the digital input code, that are configured to have resistances that are respectively weighted in an essentially binary manner according to the corresponding bits, and that are arranged in series between the upper-side terminal and the output terminal; N lower-side resistors that are respectively associated with the respective bits of the digital input code, that are configured to have resistances that are respectively weighted in an essentially binary manner according to the corresponding bits, and that are arranged in series between the lower-side terminal and the output terminal; N upper-side switches that are respectively associated with the respective bits of the digital input code, that are each arranged in parallel with a corresponding upper-side resistor, and that are each configured such that the on/off state thereof is controlled according to the corresponding bit; and N lower-side switches that are respectively associated with the respective bits of the digital input code, that are each arranged in parallel with a corresponding lower-side resistor, and that are each configured such that the on/off state thereof is controlled according to logical inversion of the corresponding bit.

With such an embodiment, the number of upper-side switches and the number of lower-side switches are not required to increase in an exponential manner even if the number of bits N increases. Thus, such an arrangement provides a reduced circuit area as compared with conventional arrangements.

Another embodiment of the present invention also relates to a D/A converter. The D/A converter comprises an upper-side terminal to which an upper-side reference voltage is applied; a lower-side terminal to which a lower-side reference voltage is applied; an output terminal configured to output the analog output voltage; a center resistor associated with the most significant bit of the digital input code, and configured to have a resistance that is weighted in an essentially binary manner according to the most significant bit; N−1 upper-side resistors that are respectively associated with the upper second bit to the least significant bit of the digital input code, that are configured to have resistances that are respectively weighted in an essentially binary manner according to the corresponding bits, and that are arranged in series between the upper-side terminal and one terminal of the center resistor; N−1 lower-side resistors that are respectively associated with the upper second bit to the least significant bit of the digital input code, that are configured to have resistances that are respectively weighted in an essentially binary manner according to the corresponding bits, and that are arranged in series between the lower-side terminal and the other terminal of the center resistor; an upper-side center switch arranged between the aforementioned one terminal of the center resistor and the output terminal, and configured such that the on/off state thereof is controlled according to the most significant bit; a lower-side center switch arranged between the other terminal of the center resistor and the output terminal, and configured such that the on/off state thereof is controlled according to logical inversion of the most significant bit; N−1 upper-side switches that are respectively associated with the upper second bit to the least significant bit of the digital input code, that are each arranged in parallel with the corresponding upper-side resistor, and that are each configured such that the on/off state thereof is controlled according to the corresponding bit; and N−1 lower-side switches that are respectively associated with the upper second bit to the least significant bit of the digital input code, that are each arranged in parallel with the corresponding lower-side resistor, and that are each configured such that the on/off state thereof is controlled according to logical inversion of the corresponding bit.

With such an embodiment, the number of upper-side switches and the number of lower-side switches are not required to increase in an exponential manner even if the number of bits N increases. Thus, such an arrangement provides a reduced circuit area as compared with conventional arrangements. Furthermore, such an arrangement requires only one resistor to be associated with the most significant bit, thereby providing a further reduction in the circuit area.

Yet another embodiment of the present invention also relates to a D/A converter. The D/A converter comprises: an upper-side terminal to which an upper-side reference voltage is applied; a lower-side terminal to which a lower-side reference voltage is applied; an output terminal configured to output the analog output voltage; a center resistor associated with the least significant bit of the digital input code, and configured to have a resistance that is weighted in an essentially binary manner according to the least significant bit; N−1 upper-side resistors that are respectively associated with the most significant bit to the lower second bit of the digital input code, that are configured to have resistances that are respectively weighted in an essentially binary manner according to the corresponding bits, and that are arranged in series between the upper-side terminal and one terminal of the center resistor; N−1 lower-side resistors that are respectively associated with the most significant bit to the lower second bit of the digital input code, that are configured to have resistances that are respectively weighted in an essentially binary manner according to the corresponding bits, and that are arranged in series between the lower-side terminal and the other terminal of the center resistor; an upper-side center switch arranged between the aforementioned one terminal of the center resistor and the output terminal, and configured such that the on/off state thereof is controlled according to the least significant bit; a lower-side center switch arranged between the other terminal of the center resistor and the output terminal, and configured such that the on/off state thereof is controlled according to logical inversion of the least significant bit; N−1 upper-side switches that are respectively associated with the most significant bit to the lower second bit of the digital input code, that are each arranged in parallel with the corresponding upper-side resistor, and that are each configured such that the on/off state thereof is controlled according to the corresponding bit; and N−1 lower-side switches that are respectively associated with the most significant bit to the lower second bit of the digital input code, that are each arranged in parallel with the corresponding lower-side resistor, and that are each configured such that the on/off state thereof is controlled according to logical inversion of the corresponding bit.

With such embodiments, the number of upper-side switches and the number of lower-side switches are not required to increase in an exponential manner even if the number of bits N increases. Thus, such an arrangement provides a reduced circuit area as compared with conventional arrangements. Furthermore, each upper-side switch and each lower-side switch are respectively required to have sufficiently small on resistances as compared with the resistance of the corresponding upper-side resistor and the corresponding lower-side resistor. By selecting, as the center resistor, the resistor having the smallest resistance, which corresponds to the least significant bit, such an arrangement allows the entire area of the upper-side switches and the lower-side switches to be reduced.

Also, a D/A converter according to an embodiment may further comprise at least one of a first cutoff switch arranged between the upper-side terminal and one terminal of the upper-side resistor string, or a second cutoff switch arranged between the lower-side terminal and one terminal of the lower-side resistor string.

By turning off the cutoff switch, such an arrangement provides reduced power consumption.

Also, a D/A converter according to an embodiment may further comprise an upper series switch that is provided for at least one bit, that is arranged in series with the upper-side resistor that corresponds to this bit, and that is configured such that its on/off state is controlled according to the logical inversion of this bit.

Also, D/A converter according to an embodiment may further comprise a lower series switch that is provided for at least one bit, that is arranged in series with the lower-side resistor that corresponds to this bit, and that is configured such that its on/off state is controlled according to this bit.

With such arrangements, irregularities or variations in the on resistances of the upper-side switches or the lower-side switches can be canceled out by means of the corresponding switch, i.e., the upper series switch or the lower series switch. Thus, such an arrangement provides improvement in the precision and temperature characteristics of the D/A converter.

Also, with such an D/A converter according to an embodiment, the resistance of each upper-side resistor may be determined such that a relation $R_i<R_{i-1}\times 2$ is satisfied, with the resistance of the upper-side resistor that corresponds to the lower i-th bit as $R_i$ (where i represents an integer that is equal to or greater than 1 and is equal to or smaller than N).

With such an arrangement, the output voltage is increased according to a digital input code while there is an overlap region in the output voltage. In a usage in which the output voltage is to be fixed to a given constant value, such an arrangement may preferably search for an input digital code that is required to provide a necessary output voltage. In this case, by providing an overlap region in the output voltage, such an arrangement is capable of performing such a search operation in a sure mariner.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, or that does not damage the functions or effects of the connection therebetween, in addition to a state in which the member A is physically and directly connected to the member B. Similarly, the state represented by the phrase "the member C is provided between the member A and the member B" includes a state in which the member A is indirectly connected to the member C, or the member B is indirectly connected to the member C via another member that does not affect the electric connection therebetween, or that does not damage the functions or effects of the connection therebetween, in addition to a state in which the member A is directly connected to the member C, or the member B is directly connected to the member C.

First Embodiment

Figure 1:
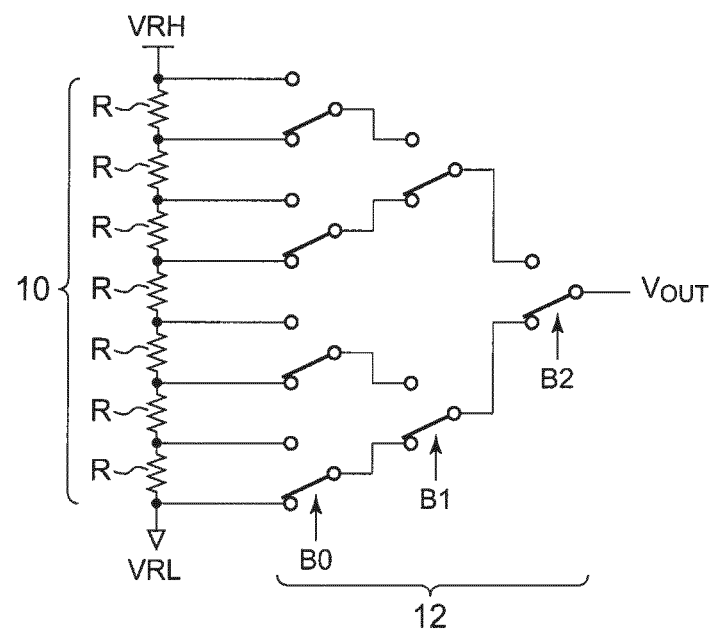
FIG. 1 is a circuit diagram which shows a configuration of a three-bit resistor string D/A converter.
Figure 2:
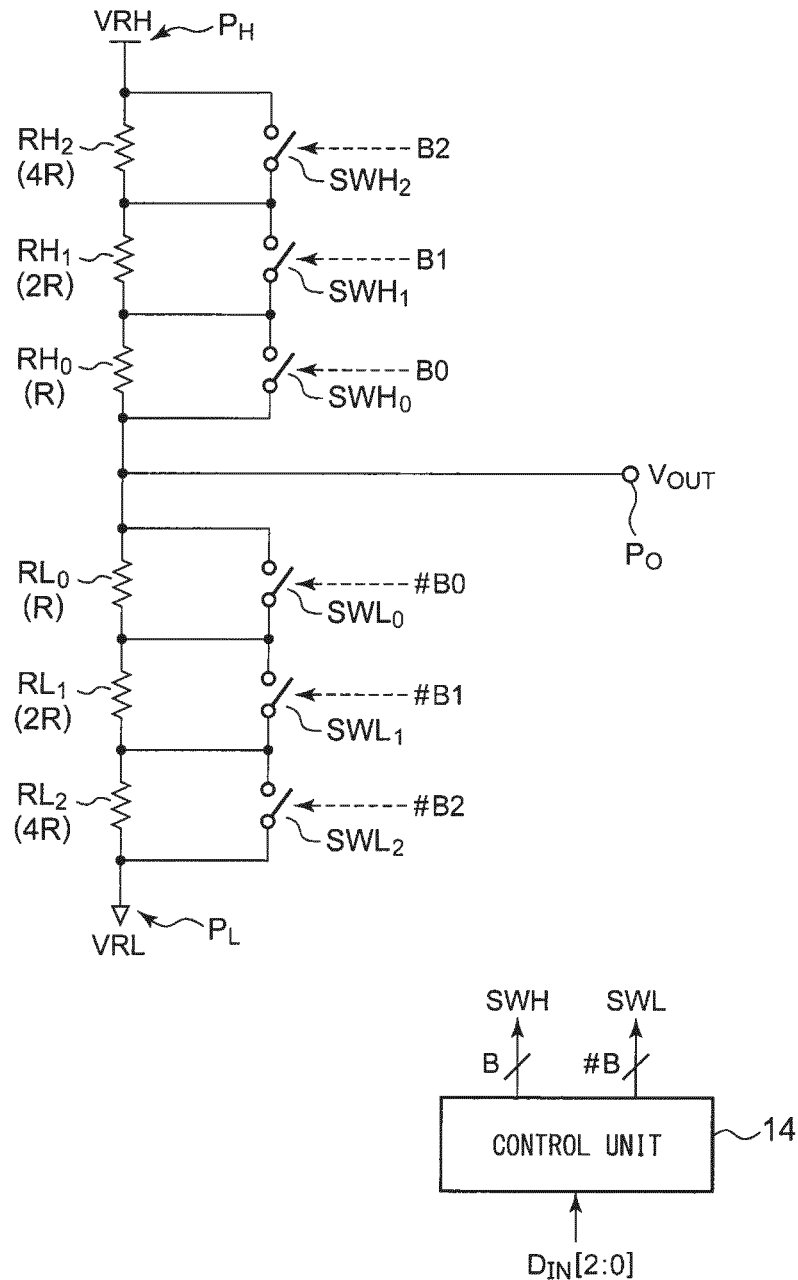
FIG. 2 is a circuit diagram which shows a configuration of a D/A converter according to a first embodiment.

FIG. 2 is a circuit diagram which shows a configuration of a D/A converter 100 according to a first embodiment. The D/A converter 100 is configured to convert an N-bit (N represents an integer) digital input code $D_{IN}[N-1:0]$ into an analog output voltage $V_{OUT}$ that corresponds to the digital input code $D_{IN}[N-1:0]$ thus input.

The D/A converter 100 includes an upper-side terminal $P_H$, a lower-side terminal $P_L$, an output terminal $P_O$, N upper-side resistors $R_H$, N lower-side resistors $R_L$, N upper-side switches SWH, and N lower-side switches SWL. FIG. 2 shows an arrangement in which N=3. The respective bits of the digital input code $D_{IN}[N-1:0]$ will be represented by, in the following order starting from the upper bit, B(N-1), B(N-2), ..., B1, B0. The symbol "#" represents logical inversion.

An upper reference voltage VRH is applied to the upper-side terminal $P_H$, and a lower-side reference voltage VRL is applied to the lower-side terminal $P_L$. An analog output voltage $V_{OUT}$ that corresponds to the digital input code $D_{IN}$ is output from the output terminal $P_O$.

The N upper-side resistors $RH_{N-1}$ through $RH_0$ are arranged in series between the upper-side terminal $P_H$ and the output terminal $P_O$, which form an upper side of the resistor string. The upper-side resistors $RH_{N-1}$ through $RH_0$ are respectively associated with the bits BN-2 through B0 of the digital input code $D_{IN}$. The resistance of each resistor $R_H$ is weighted in an essentially binary manner according to the corresponding bit (digit). That is to say, the resistance value $R_{i-1}$ of the upper-side resistor $RH_{i-1}$ that corresponds to the lower i-th bit (1≤i≤N) is determined so as to satisfy the following Expression (1) using a given unit resistance value R.

$$R_{i-1} = 2^{i-1} \times R \quad (1)$$

The order of the resistors that form the upper-side resistor string is not restricted in particular.

The N lower-side resistors $RL_{N-1}$ through $RL_0$ are arranged in series between the lower-side terminal $P_L$ and the output terminal $P_O$, which form a lower side of the resistor string. The lower-side resistors $RL_{N-1}$ through $RL_0$ are associated with the bits BN-1 through B0 of the digital input code $D_{IN}$, respectively. The resistance of each resistor RL is weighted substantially in a binary manner according to the corresponding bit (digit). That is to say, the resistance value $R_{i-1}$ of the lower-resistor $RL_{i-1}$ that corresponds to the lower i-th bit is also determined so as to satisfy the aforementioned Expression (1) Also, the order of the resistors that form the lower-side resistor string is not restricted in particular.

The N upper-side switches $SWH_{N-1}$ through $SWH_0$ are respectively associated with the bits BN-1 through B0 of the digital input code $D^{IN}$. The N upper-side switches $SWH_{N-1}$ through $SWH_0$ are each arranged in parallel with a corresponding one of the upper resistors $RH_{N-1}$ through $RH_0$.

The N lower-side switches $SWL_{N-1}$ through $SWL_0$ are associated with the bits BN-1 through B0 of the digital input code $D_{IN}$, respectively. The N lower-side switches $SWL_{N-1}$ through $SWL_0$ are each arranged in parallel with the corresponding one of the lower resistors $RL_{N-1}$ through $RL_0$.

The control unit (decoder) 14 is configured to control the on/off states of the upper switches SWH and the lower switches SWL according to the respective bits of the digital input code $D_{IN}$. The control unit 14 controls the on/off state of the upper switch $SWH_{i-1}$ that corresponds to the lower i-th bit according to the corresponding bit $B_{i-1}$. Specifically, when the value of the bit $B_{i-1}$ is 1, the control unit 14 turns on the upper switch $SWH_{i-1}$, and when the value of the bit $B_{i-1}$ is 0, the control unit 14 turns off the upper switch $SWH_{i-1}$. That is to say, the lower-side switch $SWL_{i-1}$ is controlled according to the logically inverted value ($\#B_{i-1}$) of the corresponding bit $B_{i-1}$.

The above is the configuration of the D/A converter 100. Next, description will be made regarding its operation.

Directing attention to the lower-side switch $SWL_{i-1}$ and the upper-side switch $SWH_{i-1}$ that correspond to the same bit, these switches are turned on in a complementary manner. With such an arrangement, when the switch SWH or SWL is turned on, the resistor $R_H$ or $R_L$, which is arranged in parallel with the turned-on switch, is bypassed by this switch. In an ideal configuration in which the on resistances of the switches SWH and SWL are essentially zero, and the off resistances of the switches SWH and SWL are essentially infinite, the output voltage $V_{OUT}$ is represented by the following Expression (2). In this Expression, $C_{IN}$ is a value which represents the digital input code $D_{IN}$ in the form of a decimal number.

$$V_{OUT} = (VRH - VRL) \cdot C_{IN}/(2^N - 1) + VRL \quad (2)$$

Thus, the D/A converter 100 according to the embodiment is capable of generating an output voltage $V_{OUT}$ that changes linearly with respect to the digital input code $D_{IN}$. Because the D/A converter 100 is configured such that the respective resistance values are weighted in a binary manner, such a D/A converter 100 will be referred to as a "Binary Weighted Resistor String D/A converter".

Description will be made regarding the circuit area of the D/A converter 100. The circuit area of the D/A converter 100 depends on the number of switches. The number of switches is double the number of bits N of the digital input code $D_{IN}$. Thus, such an arrangement provides a reduced circuit area as compared with a D/A converter in which the required number of switches increases in an exponential manner with respect to the number of bits N. As the number of bits N becomes greater, the effect of the reduction in the circuit area becomes greater.

Next, description will be made regarding the power consumption. With the D/A converter 100, the resistance of the resistor string arranged between the upper-side terminal $P_H$ and the lower-side terminal $P_L$ is represented by $(2^N-1) \times R$. Thus, such an arrangement provides low power consumption which is on a level comparable to conventional D/A converters. That is to say, such an arrangement has an advantage of low power consumption as compared with R-2R ladder D/A converters.

That is to say, the D/A converter 100 according to the embodiment provides both the advantages of reduced circuit area and low power consumption. Furthermore, because of its configuration, the D/A converter can be suitably implemented in the CMOS (Complementary Metal Oxide Semiconductor) process.

Figure 3A:
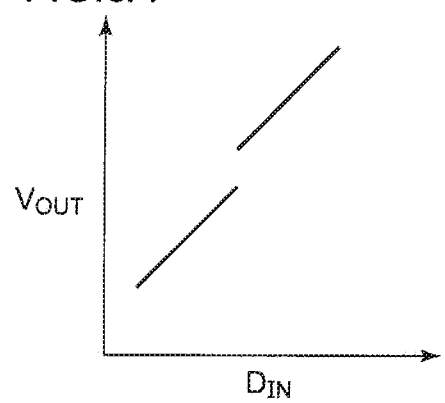
FIGS. 3A and 3B are graphs each showing the relation between the digital input code and the output voltage of the D/A converter.
Figure 3B:
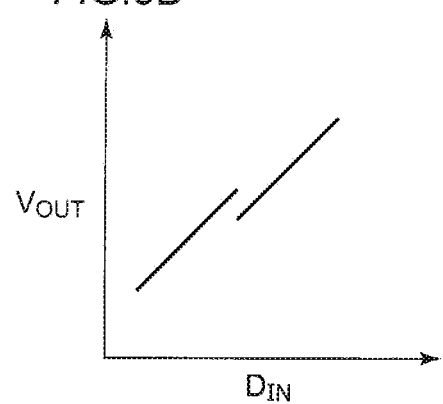

Making a comparison between the resistances of the lower $(i+1)$-th bit and the lower i-th bit, in an ideal circuit, the relation $R_i=2 \cdot R_{i-1}$ holds true. With such an arrangement, the digital input code $D_{IN}$ can be associated with the output voltage $V_{OUT}$ in a one-to-one manner. However, in a realistic circuit, the resistance values of the upper resistors $R_H$ and the lower resistors $R_L$ deviate from the relation represented by relational Expression (1) due to process variation or the like. FIGS. 3A and 3B are graphs each showing the relation between the digital input, code $D_{IN}$ and the output voltage $V_{OUT}$ of the D/A converter. When the following Expression (3) is satisfied, the output voltage $V_{OUT}$ jumps as shown in FIG. 3A, which leads to a voltage range that cannot be generated by the D/A converter 100.

$$R_i > 2 \cdot R_{i-1} \quad (3)$$

In order to solve such a problem, in a case in which there is large variation in the resistance values, the D/A converter 100 may be preferably designed so as to satisfy the following Expression (4), giving consideration to such variation.

$$R_i < 2 \cdot R_{i-1} \quad (4)$$

FIG. 3B shows the input/output characteristics of the D/A converter when Expression (4) holds true. With such an arrangement, overlapping occurs in the output voltage $V_{OUT}$. In an overlap region, there are multiple digital input codes $D_{IN}$ which each provide the same output voltage $V_{OUT}$. Accordingly, an arrangement may preferably be made in which the control unit 14 converts the digital input, code $D_{IN}$ into an intermediate code $D_{INT}$, and the upper-side switches SWH and the lower-side switches SWL are controlled according to the intermediate code $D_{INT}$ thus generated it should be noted that, in a case in which the resistance values $R_i$ are small, the resolution of the lower bits becomes rough, which leads to a large overlap region in the output voltage $V_{OUT}$. Thus, the resistance values $R_i$ may preferably be designed to be as great as possible in a range where Expression (4) holds true.

The jumping and overlapping in the output voltage $V_{OUT}$ are affected not only by the resistances of the upper-side resistors $R_H$ and the lower-side resistors $R_L$, but also by the on resistances of the switches SWH and SWL. With the on resistance of the i-th switch as $Ron_i$, the on resistances of the switches SWH and SWL are preferably designed so as to satisfy the following Expression (5).

$$Ron_{i-1} < Ron_i/2 \quad (5)$$

A search for the intermediate code $D_{INT}$ required to generate a given output voltage $V_{OUT}$ can be conducted as follows. Such a search will be referred to as "calibration".

Figure 4:
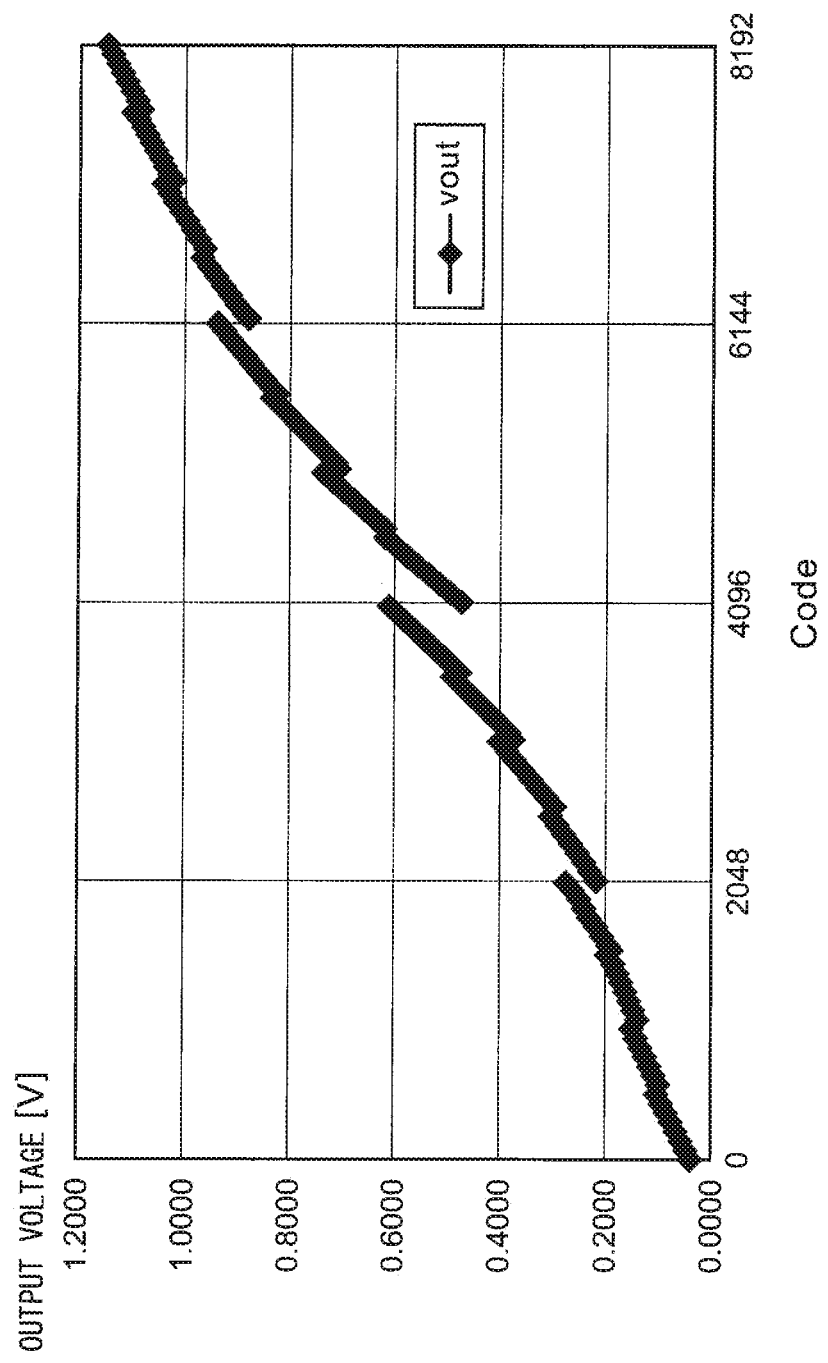
FIG. 4 is a graph which shows an example of the input/output characteristics of the D/A converter having an overlap region.

FIG. 4 is a graph which shows an example of the input/output characteristics of the D/A converter 100 configured so as to satisfy the relational Expression (4). FIG. 4 shows an arrangement in which VRH=1.2 V, VRL=0 V, and N=13 bits.

Figure 5:
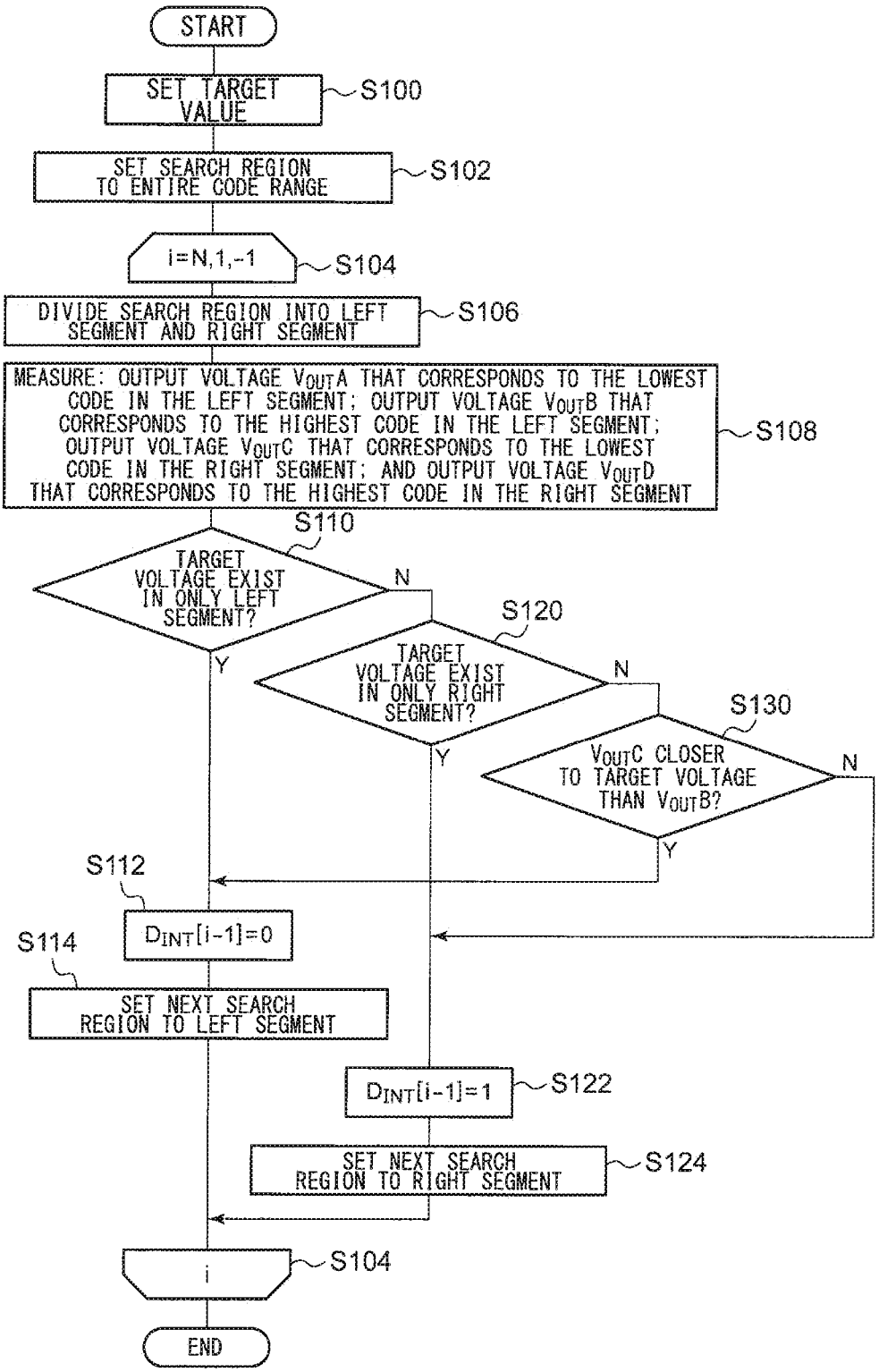
FIG. 5 is a flowchart which shows a calibration method for the D/A converter shown in FIG. 2.

FIG. 5 is a flowchart which shows a calibration method for the D/A converter 100 shown in FIG. 2. The flowchart shows an operation for searching for the intermediate code $D_{INT}$ that corresponds to a given output voltage $V_{OUT}$.

First, the output voltage (target voltage) $V_{REF}$, which is a target, is set (S100). Next, the search region is set to the entire bit range (S102). Subsequently, search processing is repeatedly performed from the most significant bit $D_{INT}[N-1]$ toward the least significant bit $D_{INT}[0]$ of the intermediate code $D_{INT}$. That is to say, the $D_{INT}[i-1]$ is sequentially determined by decrementing the variant i by 1 from N (S104).

Figure 6:
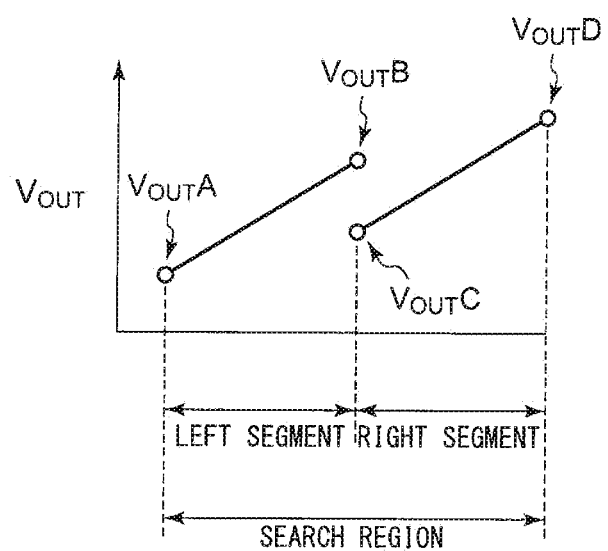
FIG. 6 is a graph which shows the search region, the right segment, the left segment, and the relation between the measured output voltages.

First, the current search region is divided at the center into a left segment and a right segment (S106). Next, the output voltage $V_{OUT}A$ obtained by supplying the lowest code in the left segment is measured, the output voltage $V_{OUT}B$ obtained by supplying the highest code in the left segment is measured, the output voltage $V_{OUT}C$ obtained by supplying the lowest code in the right segment is obtained, and the output voltage $V_{OUT}D$ obtained by supplying the highest code in the right segment is measured (S108), FIG. 6 shows a graph which shows the search region, the right segment, the left segment, and the relations among the measured output voltages.

Returning to FIG. 5, description will be made. When the target voltage $V_{REF}$ exists in only the left segment (YES in S110), $D_{INT}[i-1]=0$ is determined (S112), and the left segment is set to be the next search region. When the target voltage $V_{REF}$ exists in only the right segment (NO in S110 and YES in S120), $D_{INT}[i-1]=1$ is determined (S122), and the right segment is set to be the next search region (S124).

When the target voltage $V_{REF}$ exists in both the right segment and the left segment (NO in S120), judgment is made regarding which of the measured voltages $V_{OUT}B$ or $V_{OUT}C$ is closer to the target voltage $V_{REF}$ (S130). When the voltage $V_{OUT}C$ is closer to the target voltage $V_{REF}$ (YES in S130), $D_{INT}[i-1]=0$ is determined (S112), and the left segment is set to be the next search region. When the voltage $V_{OUT}B$ is closer to the target voltage $V_{REF}$ (NO in S130), $D_{INT}[i-1]=1$ is determined (S122), and the right segment is set to be the next search region (S124).

By executing the aforementioned operations, the bit $D_{INT}[i-1]$ of the intermediate code and the next search region are determined. Next, the flow returns to the step S104 in which the variant i is decrement, and the next bit is determined.

By performing the aforementioned operation, such an arrangement is capable of sequentially determining the respective bits of the intermediate code $D_{INT}$ from the most significant bit to the least significant bit.

It should be noted that the step S130 may be omitted. In this case, judgment may be determined beforehand regarding whether the flow is to proceed to Steps S112 and S114 or otherwise Steps S122 and S124 when the target voltage $V_{REF}$ exists in both the right, segment and the left segment.

By designing the D/A converter 100 so as to provide an overlap region in the output voltage $V_{OUT}$ as described above, by means of the aforementioned calibration, such an arrangement is capable of determining an intermediate code $D_{INT}$ that provides a desired output voltage $V_{OUT}$. With such an arrangement, if the D/A converter 100 is employed, the intermediate code $D_{INT}$ that provides the required output voltage $V_{OUT}$ may be preferably supplied to the D/A converter 100 as the digital input code $D_{IN}$. Alternatively, an arrangement may be made in which the correspondence relation between the digital input code $D_{IN}$ and the intermediate code $D_{INT}$ is stored in the form of a table, and the intermediate code $D_{INT}$ that corresponds to the digital input code $D_{IN}$ is generated so as to control the switches.

It should be noted that, if there is an overlap region in the vicinity of the least significant bit, this could lead to an unnecessary reduction in the resolution of the D/A converter. In order to solve such a problem, the resistance value should be determined so as not to provide an overlap region for at least the least significant bit. With such an arrangement, the loop operation in Step S104 may be omitted for i=2 and i=1. In this case, the least significant bit $D_{INT}[0]$ of the intermediate code $D_{INT}$ may be determined according to a comparison result regarding which of the measured voltages $V_{OUT}A$ through $V_{OUT}D$ is closest to the reference voltage $V_{REF}$.

Second Embodiment

Figure 7:
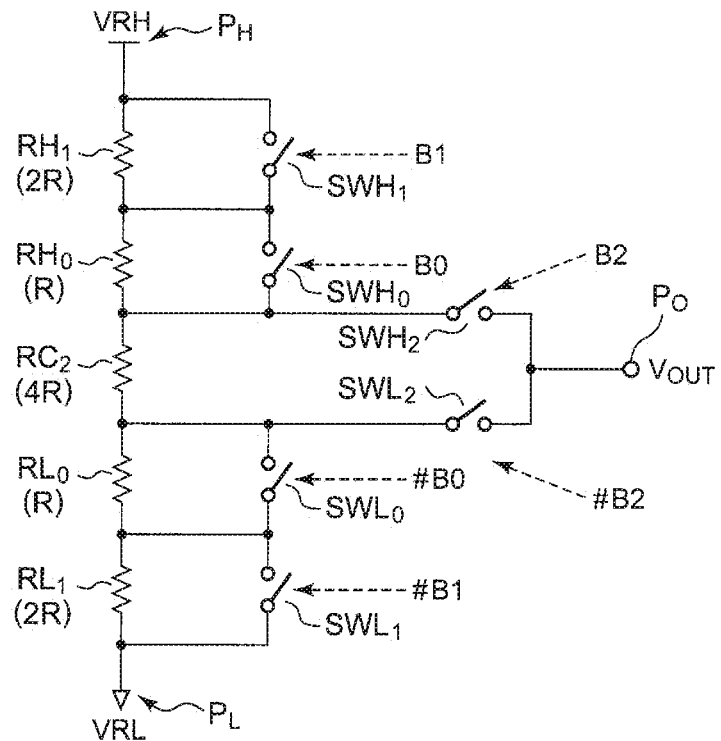
FIG. 7 is a circuit diagram which shows a configuration of a D/A converter according to a second embodiment.
Figure 7:
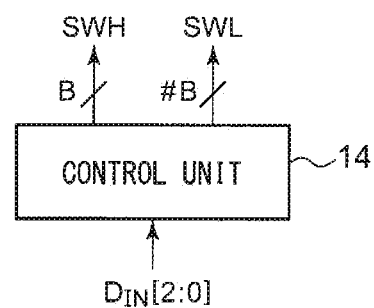

FIG. 7 is a circuit diagram which shows a configuration of a D/A converter 100a according to a second embodiment. The D/A converter 100a shown in FIG. 7 includes a center resistor $RC_{N-1}$, and center switches $SWH_{N-1}$ and $SWL_{N-1}$, instead of the upper-side resistor the lower-side resistor $RH_{N-1}$, the upper-side switch $SWH_{N-1}$ and the lower-side switch which are components of the D/A converter 100 shown in FIG. 2 that correspond to the most significant bit BN-1 of the digital input code $D_{IN}$.

The center resistor $RC_{N-1}$ is assigned to the most significant bit $D_{IN}[N-1]$, and its resistance value is represented by $2^{N-1} \times R$.

N-1 upper-side resistors, i.e., $RH_{N-2}$ through $RH_0$, are connected in series between the upper-side terminal $P_H$ and one terminal of the center resistor $RC_{N-1}$. The upper-side resistors $RH_{N-2}$ through $RH_0$ are associated with the upper second bit to the least significant bit, respectively, of the digital input code $D_{IN}$. Each resistance value is weighted in an essentially binary manner according to the corresponding bit (digit).

N-1 lower-side resistors, i.e., $RL_{N-2}$ through $RL_0$, are connected in series between the lower-side terminal $P_L$ and the other terminal of the center resistor $RC_{N-1}$. The lower-side resistors $RL_{N-2}$ through $RL_0$ are associated with the upper second bit to the least significant bit, respectively, of the digital input code $D_{IN}$. Each resistance value is weighted in an essentially binary manner according to the corresponding bit (digit).

The upper-side center switch $SWH_{N-1}$ is arranged between one terminal of the center resistor $RC_{N-1}$ and the output terminal $P_O$. The lower-side center switch $SWL_{N-1}$ is arranged between the other terminal of the center resistor $RC_{N-1}$ and the output terminal $P_O$.

The on/off state of the upper-side center switch $SWH_{N-1}$ is controlled according to the most significant bit $D_{IN}[N-1]$ (BN-1). The on/off state of the lower-side center switch $SWL_{N-1}$ is controlled according to the logical inversion (#BN-1) of the most significant bit $D_{IN}[N-1]$.

The D/A converter 100a shown in FIG. 7 provides a reduced number of resistors assigned to the most significant bit, as compared with a configuration shown in FIG. 2. The resistor assigned to the most significant bit requires the highest resistance. Thus, by reducing the number of resisters required for the most significant bit, such an arrangement provides a D/A converter 100a having a further reduction in the circuit area.

Third Embodiment

Figure 8:
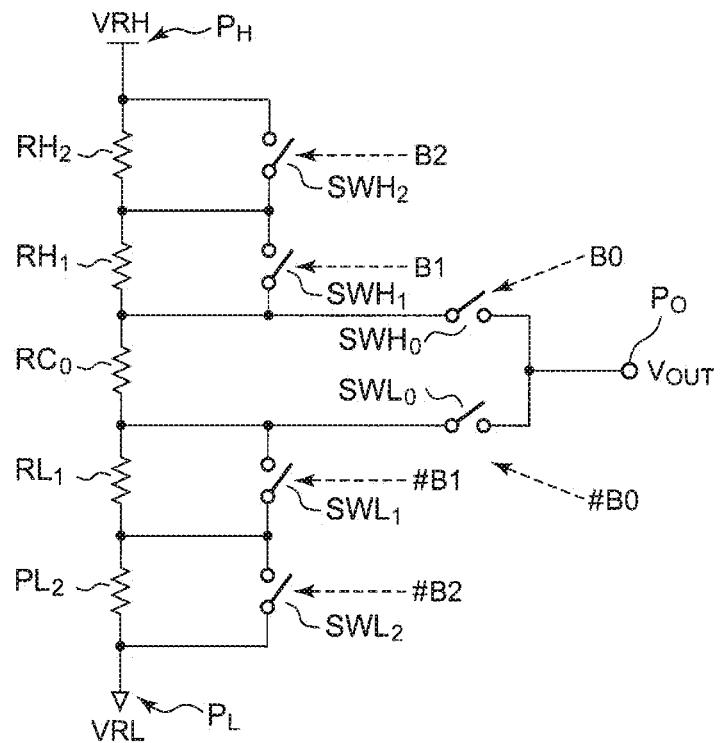
FIG. 8 is a circuit diagram which shows a configuration of a D/A converter according to a third embodiment.
Figure 8:
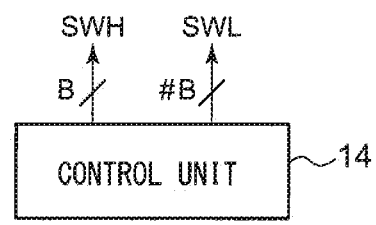

FIG. 8 is a circuit diagram which shows a configuration of a D/A converter 100b according to a third embodiment. The D/A converter 100b shown in FIG. 8 includes a center resistor $RC_0$ and center switches $SWH_0$ and $SWL_0$, instead of the upper-side resistor $RH_0$, the lower-side resistor $RL_0$, and the upper-side switches $SWH_0$ and $SWL_0$, which are components of the D/A converter 100 shown in FIG. 2 that correspond to the least significant bit B0 of the digital input code $D_{IN}$.

The center resistor $RC_0$ is assigned to the least significant bit $D_{IN}[0]$. The resistance of the center resistor $RC_0$ is represented by R.

N-1 upper-side resistors, i.e., $RH_{N-1}$ through $RH_1$, are connected in series between the upper-side terminal $P_H$ and one terminal of the center resistor $RC_0$. The upper-side resistors $RH_{N-1}$ through $RH_1$ are associated with the most significant bit to the lower second bit, respectively, of the digital input code $D_{IN}$. Each resistance value is weighted in an essentially binary manner according to the corresponding bit (digit).

N-1 lower-side resistors, i.e., $RL_{N-1}$ through $RL_1$, are connected in series between the lower-side terminal $P_L$ and the other terminal of the center resistor $RC_0$. The lower-side resistors $RL_{N-1}$ through $RL_1$ are associated with the most significant bit to the lower second bit, respectively, of the digital input code $D_{IN}$. Each resistance value is weighted in an essentially binary manner according to the corresponding hit (digit).

The upper-side center switch $SWH_0$ is arranged between one terminal of the center resistor $RC_0$ and the output terminal $P_O$. The lower-side center switch $SWL_0$ is arranged between the other terminal of the center resistor $RC_0$ and the output terminal $P_O$.

The on/off state of the upper-side center switch $SWH_0$ is controlled according to the least significant bit $D_{IN}[0]$ (B0). The on/off state of the lower-side center switch $SWL_0$ is controlled according to the logical inversion (#B0) of the least significant hit $D_{IN}[0]$.

The D/A converter 100b shown in FIG. 8 provides a reduced number of resistors assigned to the least significant bit, as compared with a configuration shown in FIG. 2. Furthermore, the switches $SWH_i$ and $SWL_i$ (i≠0) are respectively required to have sufficient low on resistances as compared with the resistors $RH_i$ and $RL_i$ that are respectively arranged in parallel with the switches $SWH_i$ and $SWL_i$. In contrast, the on resistances of the center switches $SWH_0$ and $SWL_0$ can be determined regardless of the resistance of the center resistor $RC_0$. Thus, by assigning the center resistor $RC_0$ the least significant bit, such an arrangement provides a reduction in the overall area of the switches, as compared with the overall switch area shown in FIG. 2 or otherwise that shown in FIG. 7. Thus, such an arrangement provides a reduction in the overall area of the D/A converter.

Which of the circuit area of the D/A converter 100a shown in FIG. 7 or the circuit area of the D/A converter 100b shown in FIG. 8 produces a smaller circuit area is determined on a case by case basis, i.e., depending on the kind of process for manufacturing the D/A converter 100, the number of bits N, and so forth. Thus, regarding the most significant bit and the least significant bit, the designer should determine as appropriate which is to be assigned to the center resistor.

Description has been made regarding the present invention with reference to the embodiments. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

[First Modification]

Figure 9:
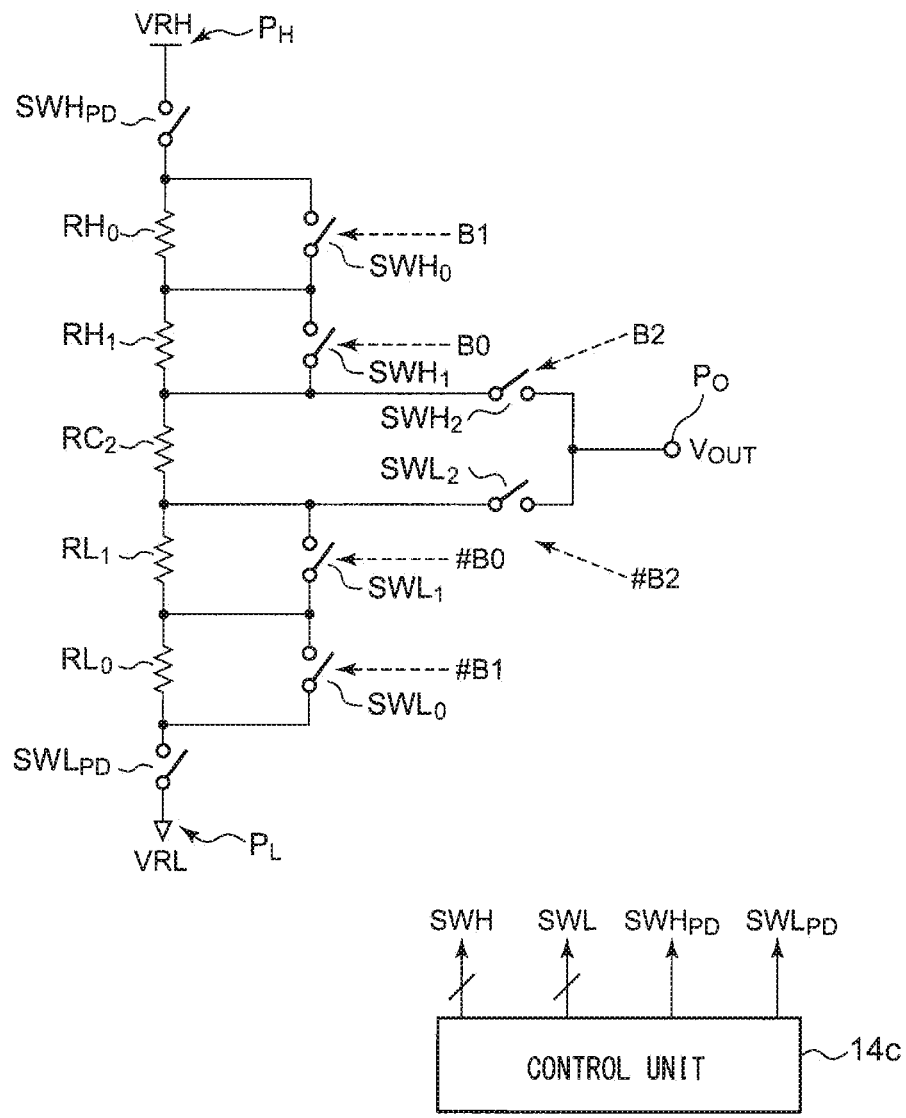
FIG. 9 is a circuit diagram which shows a configuration of a D/A converter according to a first modification.

FIG. 9 is a circuit diagram which shows a configuration of a D/A converter 100c according to a first modification. The D/A converter 100c shown in FIG. 9 further includes a first cutoff switch $SWH_{PD}$ and a second cutoff switch $SWL_{PD}$, in addition to the components of the D/A converter 100a shown in FIG. 7.

The first cutoff switch $SWH_{PD}$ is arranged between the upper-side terminal $P_H$ and one terminal of the upper-side resistor string. The second cutoff switch $SWL_{PD}$ is arranged between the lower-side terminal $P_L$ and one terminal of the lower-side resistor string.

In the non-operating state of the D/A converter 100c, the control unit 14c turns off the cutoff switches $SWH_{PD}$ and $SWL_{PD}$.

In the non-operating state, such a modification is capable of cutting off the current that flows from the upper-side terminal $P_H$ to the lower-side terminal $P_L$, thereby providing a reduction in the standby power consumption. In the standby state, in a case in which the output voltage $V_{OUT}$ is to be set to high impedance, both the two cutoff switches $SWH_{PD}$ and $SWL_{PD}$ may preferably be turned off. In a case in which the output voltage $V_{OUT}$ is to be set to high level in the standby state, the cutoff switch $SWH_{PD}$ may preferably be turned on, and the cutoff switch $SWL_{PD}$ may preferably be turned off. In a case in which the output voltage $V_{OUT}$ is to be set to low level in the standby state, the cutoff switch $SWH_{PD}$ may preferably be turned off, and the cutoff switch $SWL_{PD}$ may preferably be turned on.

It should be noted that such an arrangement may include only one of either the cutoff switches $SWH_{PD}$ or $SWL_{PD}$. Also, the cutoff switches $SWH_{PD}$ and $SWL_{PD}$ may be combined with an arrangement shown in FIG. 2, an arrangement shown in FIG. 8, or otherwise other modifications.

[Second Modification]

Figure 10:
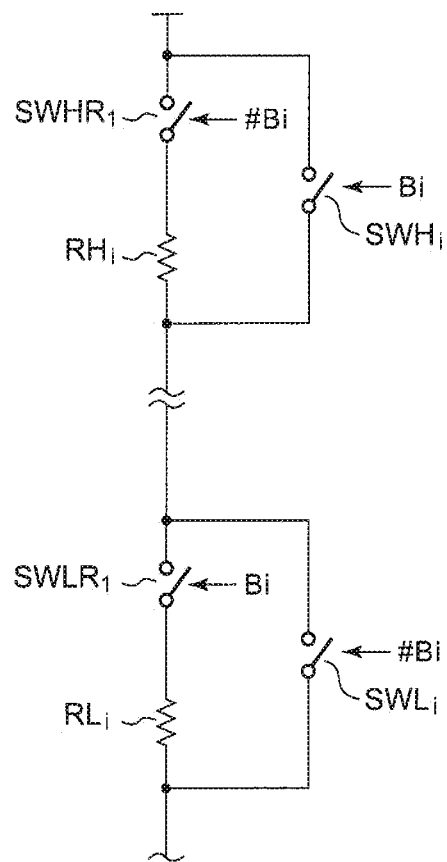
FIG. 10 is a circuit diagram which shows a part of the configuration of a D/A converter according to a second modification.

FIG. 10 is a circuit diagram which shows a part of the configuration of a D/A converter 100d according to a second modification. The second modification can be combined with an arrangement shown in FIG. 2, an arrangement shown in FIG. 7, an arrangement shown in FIG. 8, or otherwise other modifications.

The D/A converter 100d further includes an upper-side series switch $SWHR_i$ and a lower-side series switch $SWLR_i$. The upper-side series switch $SWHR_i$ is provided for at least one bit. That is to say, the upper-side series switch $SWHR_i$ is arranged in series with the upper-side resistor $RH_i$ that corresponds to this bit Bi. The on/off state of the upper-side series switch $SWHR_i$ is controlled according to the logical inversion #Bi of this bit.

The lower-side series switch $SWLR_i$ is provided for at least one bit. That is to say, the lower-side series switch $SWLR_i$ is arranged in series with the lower-side resistor $RL_i$ that corresponds to this bit. The on/off state of the lower-side series switch $SWLR_i$ is controlled according to this bit Bi.

By providing the series switches $SWHR_i$ and $SWLR_i$, the on resistance of the switch. $SWHR_i$ or $SWLR_i$ is always provided in series regardless of the value of the digital input code $D_{IN}$ input to the D/A converter. Thus, such an arrangement as capable of suppressing the effects of fluctuation in the on resistances of the switches $SWH_i$ and $SWL_i$, thereby providing the D/A converter with improved precision and improved temperature characteristics.

While the preferred embodiments of the present invention have been described using specific terms, such description is for illustrative purposes only, and it is to be understood that changes and variations may be made without departing from the spirit or scope of the appended claims.

What is claimed is:

1. A D/A converter configured to convert an N-bit (N represents an integer) digital input code into an analog output voltage that corresponds to the digital input code, the D/A converter comprising:

an upper-side terminal to which an upper-side reference voltage is applied;

a lower-side terminal to which a lower-side reference voltage is applied;

an output terminal configured to output the analog output voltage;

a center resistor associated with the most significant bit of the digital input code, and configured to have a resistance that is weighted in an essentially binary manner according to the most significant bit;

N-1 upper-side resistors that are respectively associated with the upper second bit to the least significant bit of the digital input code, that are configured to have resistances that are respectively weighted in an essentially binary manner according to the corresponding bits, and that are arranged in series between the upper-side terminal and one terminal of the center resistor;

N-1 lower-side resistors that are respectively associated with the upper second bit to the least significant bit of the digital input code, that are configured to have resistances that are respectively weighted in an essentially binary manner according to the corresponding bits, and that are arranged in series between the lower-side terminal and the other terminal of the center resistor;

an upper-side center switch arranged between the aforementioned one terminal of the center resistor and the output terminal, and configured such that the on/off state thereof is controlled according to the most significant bit;

a lower-side center switch arranged between the other terminal of the center resistor and the output terminal, and configured such that the on/off state thereof is controlled according to logical inversion of the most significant bit;

N-1 upper-side switches that are respectively associated with the upper second bit to the least significant bit of the digital input code, that are each arranged in parallel with the corresponding upper-side resistor, and that are each configured such that the on/off state thereof is controlled according to the corresponding bit; and N-1 lower-side switches that are respectively associated with the upper second bit to the least significant bit of the digital input code, that are each arranged in parallel with the corresponding lower-side resistor, and that are each configured such that the on/off state thereof is controlled according to logical inversion of the corresponding bit.

2. The D/A converter according to claim 1, further comprising a first cutoff switch arranged between the upper-side terminal and one terminal of the upper-side resistor string.

3. The D/A converter according to claim 1, further comprising a second cutoff switch arranged between the lower-side terminal and one terminal of the lower-side resistor string.

4. The D/A converter according to claim 1, further comprising an upper series switch that is provided for at least one bit, that is arranged in series with the upper-side resistor that corresponds to this bit, and that is configured such that its on/off state is controlled according to the logical inversion of this bit.

5. The D/A converter according to claim 1, further comprising a lower series switch that is provided for at least one bit, that is arranged in series with the lower-side resistor that corresponds to this bit, and that is configured such that its on/off state is controlled according to this bit.

6. The D/A converter according to claim 1, wherein the resistance of each upper-side resistor is determined such that a relation $R_1 < R_{i-1} \times 2$ is satisfied, with the resistance of the upper-side resistor that corresponds to the lower i-th bit as $R_i$ (where i represents an integer that is equal to or greater than 1 and is equal to or smaller than N).

* * * * *